(12) United States Patent
Ishibashi

(10) Patent No.: US 10,861,805 B2
(45) Date of Patent: Dec. 8, 2020

(54) HIGH FREQUENCY MODULE

(71) Applicant: FUJITSU LIMITED, Kawasaki (JP)

(72) Inventor: Daijiro Ishibashi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/447,141

(22) Filed: Jun. 20, 2019

(65) Prior Publication Data

US 2019/0311998 A1  Oct. 10, 2019

Related U.S. Application Data

(63) Continuation of application No. PCT/JP2017/046388, filed on Dec. 25, 2017.

(30) Foreign Application Priority Data

Jan. 12, 2017  (JP) .................. 2017-003521

(51) Int. Cl.
*H01L 31/00* (2006.01)
*H01L 23/66* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC ............. H01L 21/4853; H01L 21/4857; H01L 21/565; H01L 21/568; H01L 23/12;
(Continued)

(56) References Cited

U.S. PATENT DOCUMENTS

2014/0320364 A1* 10/2014 Gu .................... H01Q 13/0225
343/786
2015/0179589 A1   6/2015 Takagi
(Continued)

FOREIGN PATENT DOCUMENTS

JP   2015-126289 A   7/2015
JP   2015-149671 A   8/2015
(Continued)

OTHER PUBLICATIONS

International Search Report dated Mar. 20, 2018, issued in counterpart International Application No. PCT/JP2017/046388 (1 page).

*Primary Examiner* — Jami Valentine Miller
*Assistant Examiner* — Dilinh P Nguyen
(74) *Attorney, Agent, or Firm* — Westerman, Hattori, Daniels & Adrian, LLP

(57) ABSTRACT

A high frequency module includes: a package section including a semiconductor chip, a first portion of a backshort being integrated with the semiconductor chip by a first resin, and a first rewiring line electrically coupled to the semiconductor chip and including a portion to be an antenna coupler; and a waveguide with which a second portion of the backshort is integrated, wherein the package section and the waveguide are integrated by a second resin, to position the portion to be the antenna coupler between the waveguide and the backshort.

4 Claims, 15 Drawing Sheets

(51) Int. Cl.
- *H01L 21/48* (2006.01)
- *H01L 21/56* (2006.01)
- *H01L 23/31* (2006.01)
- *H01L 23/538* (2006.01)
- *H01L 23/00* (2006.01)
- *H01P 5/107* (2006.01)
- *H01Q 1/22* (2006.01)
- *H01Q 13/02* (2006.01)
- *H01P 5/08* (2006.01)
- *H01P 11/00* (2006.01)
- *H01L 23/28* (2006.01)
- *H01L 23/12* (2006.01)
- *H01P 3/12* (2006.01)

(52) U.S. Cl.
CPC .......... *H01L 21/565* (2013.01); *H01L 21/568* (2013.01); *H01L 23/12* (2013.01); *H01L 23/28* (2013.01); *H01L 23/3121* (2013.01); *H01L 23/5383* (2013.01); *H01L 23/5389* (2013.01); *H01L 24/19* (2013.01); *H01L 24/20* (2013.01); *H01P 3/12* (2013.01); *H01P 5/08* (2013.01); *H01P 5/107* (2013.01); *H01P 11/00* (2013.01); *H01Q 1/2283* (2013.01); *H01Q 13/02* (2013.01); *H01L 21/56* (2013.01); *H01L 2223/6633* (2013.01); *H01L 2223/6677* (2013.01); *H01L 2224/214* (2013.01)

(58) Field of Classification Search
CPC . H01L 23/28; H01L 23/3121; H01L 23/5383; H01L 23/5389; H01L 24/19; H01L 24/20; H01P 3/12; H01P 5/08; H01P 5/107; H01P 11/00; H01Q 1/2283; H01Q 13/02
USPC .......................................................... 257/428
See application file for complete search history.

(56) References Cited

U.S. PATENT DOCUMENTS

| | | |
|---|---|---|
| 2015/0229017 A1 | 8/2015 | Suzuki et al. |
| 2015/0262842 A1* | 9/2015 | Iijima .................... H01L 21/52 257/664 |
| 2015/0364830 A1 | 12/2015 | Tong et al. |
| 2017/0125871 A1 | 5/2017 | Ishibashi |

FOREIGN PATENT DOCUMENTS

| | | |
|---|---|---|
| JP | 2015-177423 A | 10/2015 |
| WO | 2016/016968 A1 | 2/2016 |

* cited by examiner

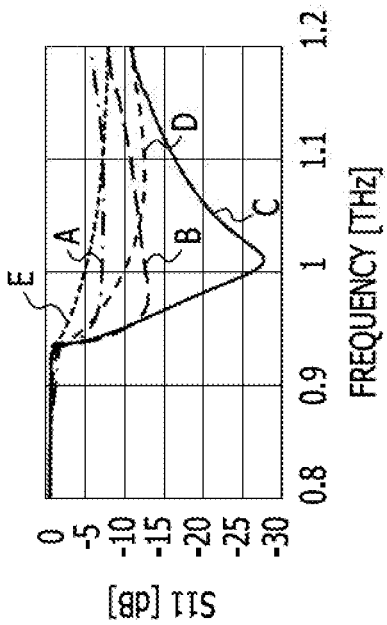
FIG. 2A
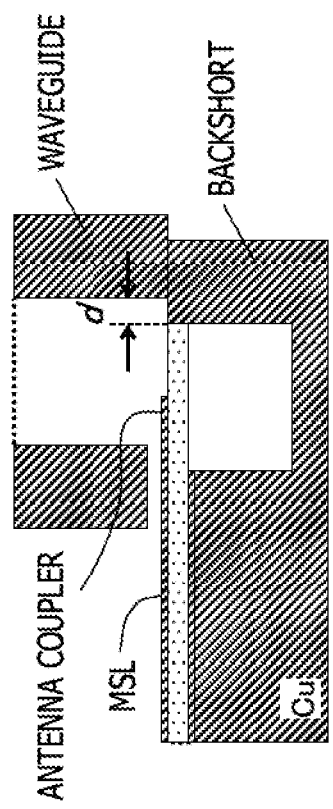
FIG. 2B
FIG. 2C
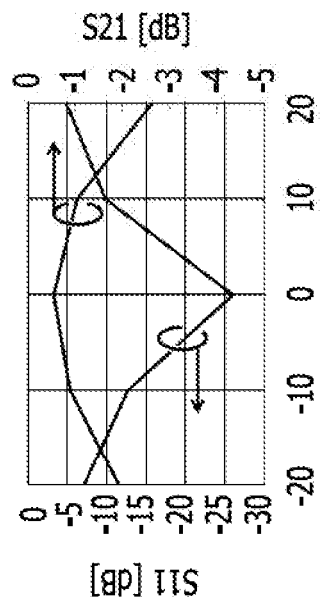
FIG. 2D
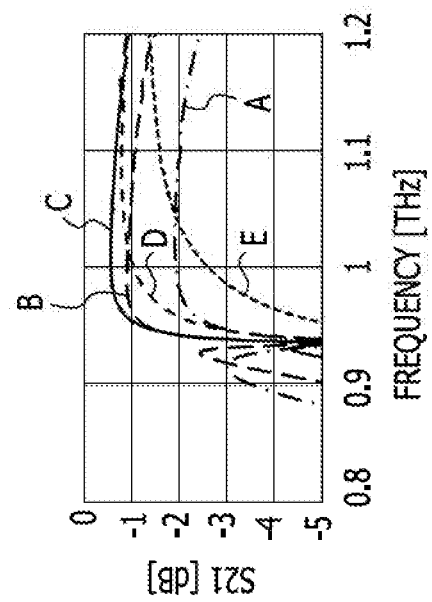

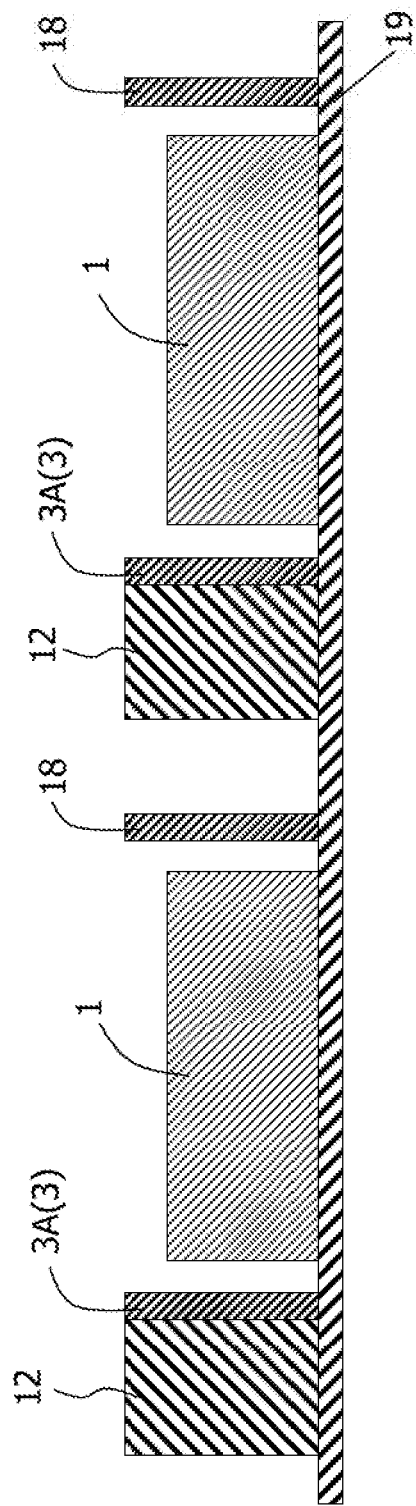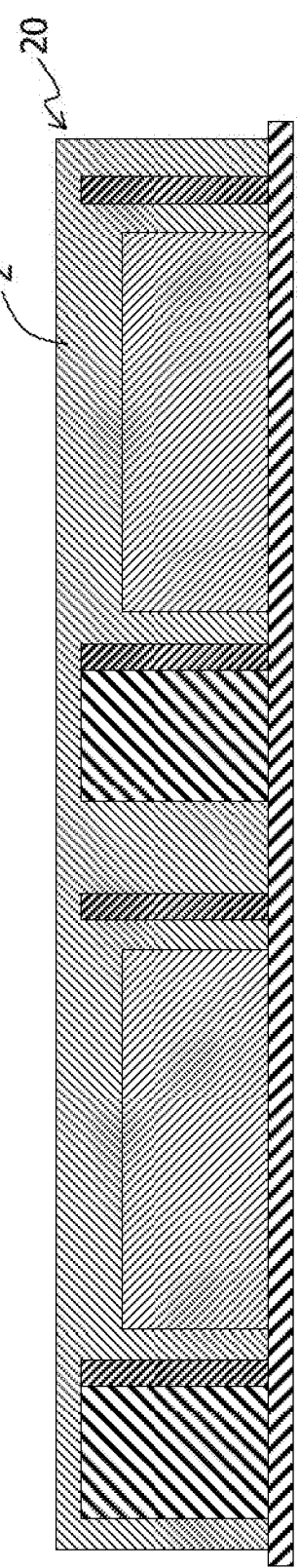

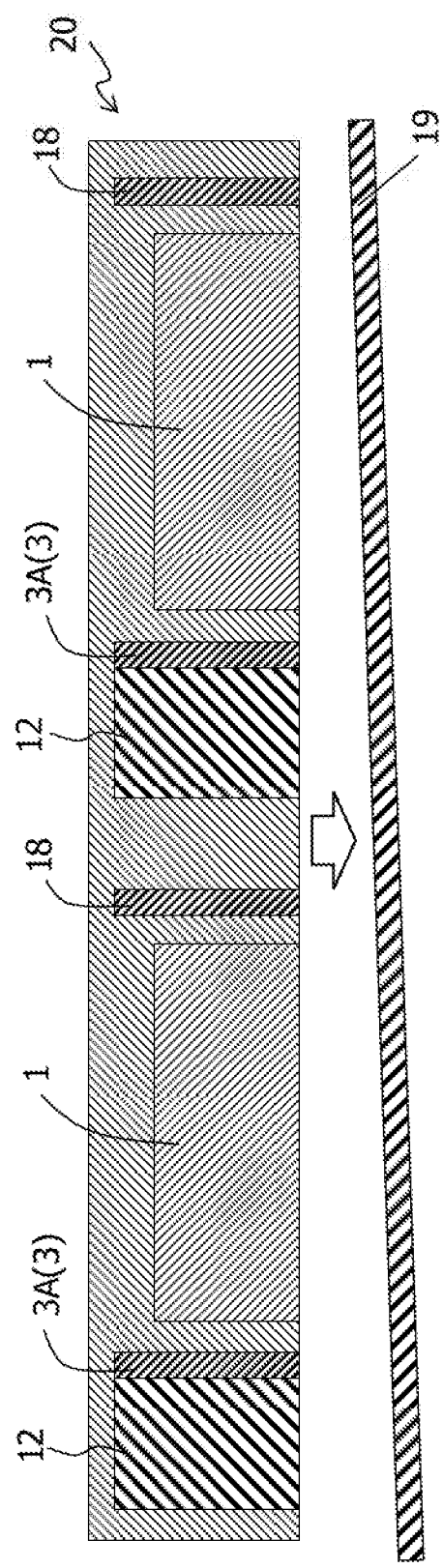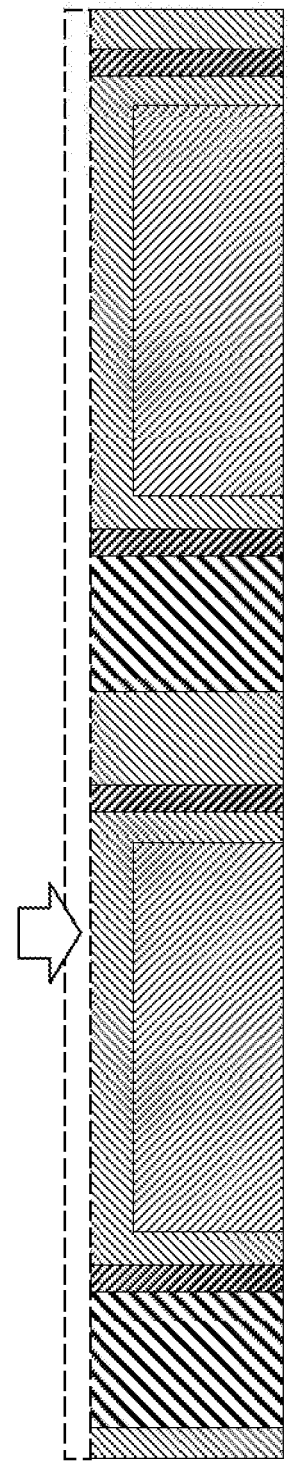

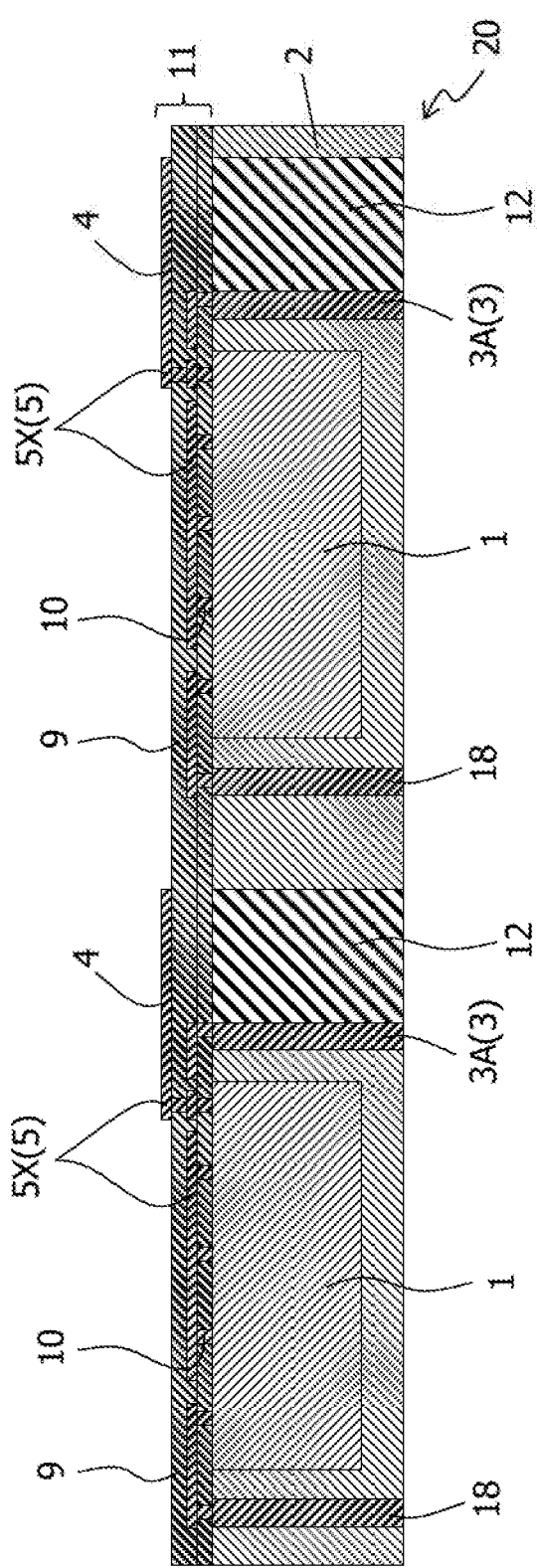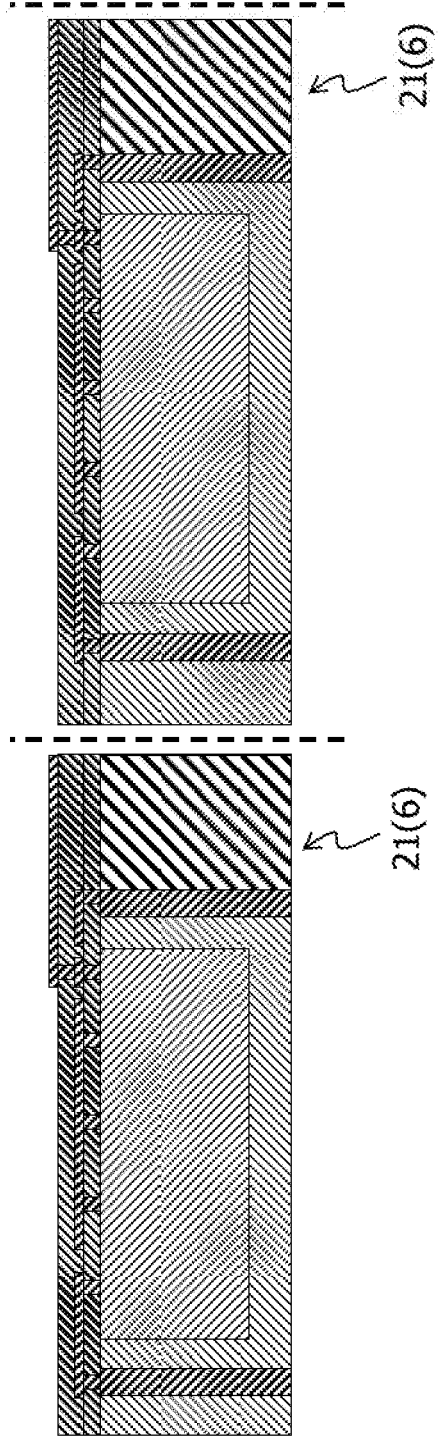

HIGH FREQUENCY MODULE

CROSS-REFERENCE TO RELATED APPLICATION

This application is a continuation application of International Application PCT/JP2017/046388 filed on Dec. 25, 2017 and designated the U.S., the entire contents of which are incorporated herein by reference. The International Application PCT/JP2017/046388 is based upon and claims the benefit of priority of the prior Japanese Patent Application No. 2017-003521, filed on Jan. 12, 2017, the entire contents of which are incorporated herein by reference.

FIELD

The embodiment discussed herein is related to a high frequency module and a method of manufacturing the high frequency module.

BACKGROUND

A low-loss hollow waveguide is normally used for propagation of high-frequency signals exceeding millimeter waves, for example.

International Publication Pamphlet No. WO 2016/016968 and Japanese Laid-open Patent Publication No. 2015-177423 are disclosed as related art.

SUMMARY

According to an aspect of the embodiments, a high frequency module includes: a package section including a semiconductor chip, a first portion of a backshort being integrated with the semiconductor chip by a first resin, and a first rewiring line electrically coupled to the semiconductor chip and including a portion to be an antenna coupler; and a waveguide with which a second portion of the backshort is integrated, wherein the package section and the waveguide are integrated by a second resin, to position the portion to be the antenna coupler between the waveguide and the backshort.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A through 2D are diagrams for explaining the influence of positional deviation on characteristics in a case where surface mounting of a waveguide is performed; FIG. 2A is a view illustrating an analysis model; FIG. 2B is a chart depicting reflection characteristics; FIG. 2C is a chart depicting pass characteristics; and FIG. 2D is a chart depicting the influence of positional deviation at 1 THz on reflection characteristics and pass characteristics;

FIGS. 4A and 4B are schematic cross-sectional views for explaining a method of manufacturing a high frequency module according to the present embodiment;

FIGS. 5A and 5B are schematic cross-sectional views for explaining the method of manufacturing a high frequency module according to the present embodiment;

FIGS. 6A and 6B are schematic cross-sectional views for explaining the method of manufacturing a high frequency module according to the present embodiment;

FIG. 7A is a perspective view; FIG. 7B is a front view; and FIG. 7C is a cross-sectional view;

DESCRIPTION OF EMBODIMENTS

For example, a transmission line having a central conductor is used for inputting and outputting signals to and from a semiconductor chip, to connect to a terminal. Therefore, to connect the semiconductor chip to the hollow waveguide, a structure for converting propagation mode and impedance is provided between the hollow waveguide and the transmission line having the central conductor.

Figure 14:
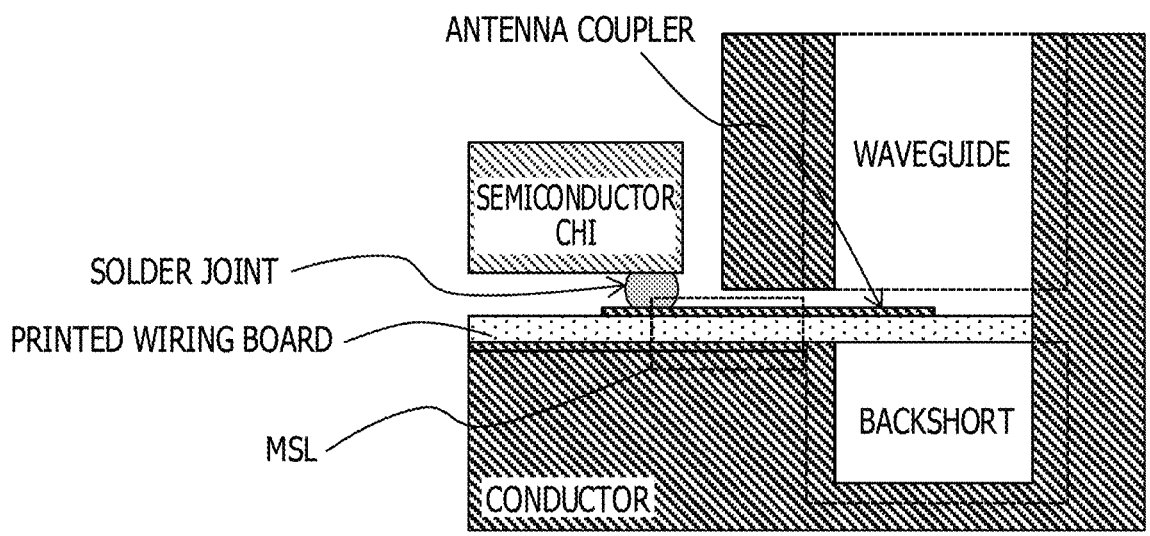
FIG. 14 is a schematic cross-sectional view illustrating the structure of a conventional high frequency module.

In a case where a microstrip line (hereinafter referred to as MSL) is used as a transmission line, part of the MSL may be inserted into a waveguide so that the part of the MSL can function as an antenna coupler, as illustrated in FIG. 14, for example. In this case, one side of the waveguide is designed to have a short-circuit structure called a backshort having a length that is ¼ of the wavelength, so that matching can be achieved.

In this structure, the semiconductor chip and the MSL are usually connected by a solder or the like. However, in a superhigh frequency region with terahertz waves, for example, it is difficult to ignore the dimensions of the connecting portions, and therefore, loss and reflection are caused. Further, the length of the MSL also affects the characteristics, and therefore, it is desirable to make the MSL as short as possible.

Figure 15A:
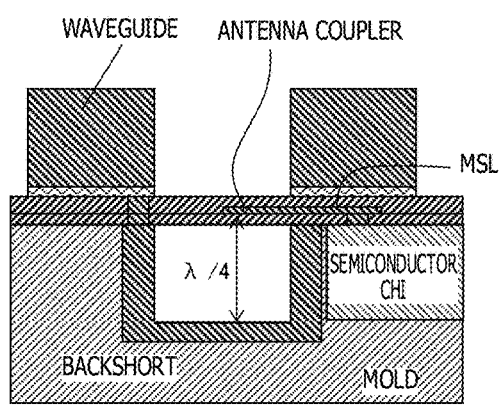
FIGS. 15A and 15B are schematic cross-sectional views illustrating the structure of a high frequency module for solving the problems in the conventional high frequency module illustrated in FIG. 14.
Figure 15B:
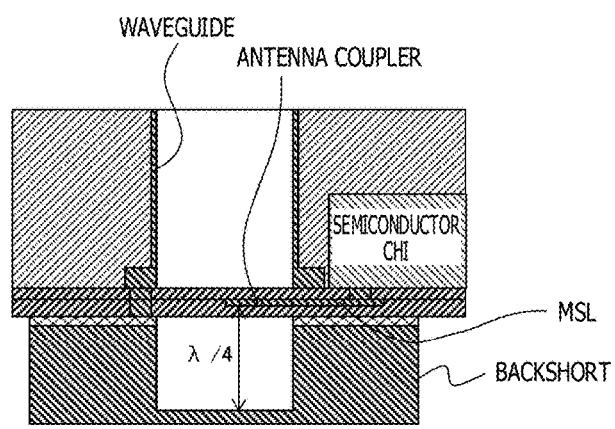

In view of this, an MSL-waveguide conversion structure utilizing the fan-out wafer level package (hereinafter referred to as FO-WLP) technique may be used, as illustrated in FIGS. 15A and 15B, for example.

FIG. 15A illustrates a backshort-containing MSL-waveguide conversion structure in which the semiconductor chip and a backshort are integrated by resin. FIG. 15B illustrates a waveguide-containing MSL-waveguide conversion structure in which a semiconductor chip and a waveguide are integrated by resin. With the use of such a conversion structure, a semiconductor chip and a backshort or a waveguide are integrated by resin, an antenna coupler and an MSL are formed by a rewiring technique, and the MSL is electrically connected to the semiconductor chip without any solder or the like. Thus, it is possible to reduce characteristics degradation in a superhigh frequency region due to mounting. Further, the length of the MSL can be made shorter, and thus, the influence of the MSL on the characteristics can be reduced.

In such a conversion structure, however, surface mounting of a waveguide (or a backshort) is performed on the structure in which a semiconductor chip and the backshort (or the waveguide) are integrated by resin, and an antenna coupler and an MSL are formed by a rewiring technique. Therefore, in either case, positional deviation occurs between, the waveguide and the backshort. That is, the waveguide and the backshort form a discontinuous structure, resulting in degradation of characteristics (see FIGS. 2A through 2D, for example).

For example, degradation of characteristics due to positional deviation between a waveguide and a backshort may be reduced.

The following is a description of a high frequency module and a method of manufacturing the high frequency module according to an embodiment of the present invention, with reference to FIGS. 1 through 13.

The high frequency module according to the present embodiment is a high frequency module mounted on a radar, a sensor, or a wireless communication system that uses high frequency waves such as millimeter waves or terahertz waves, for example.

Figure 1:
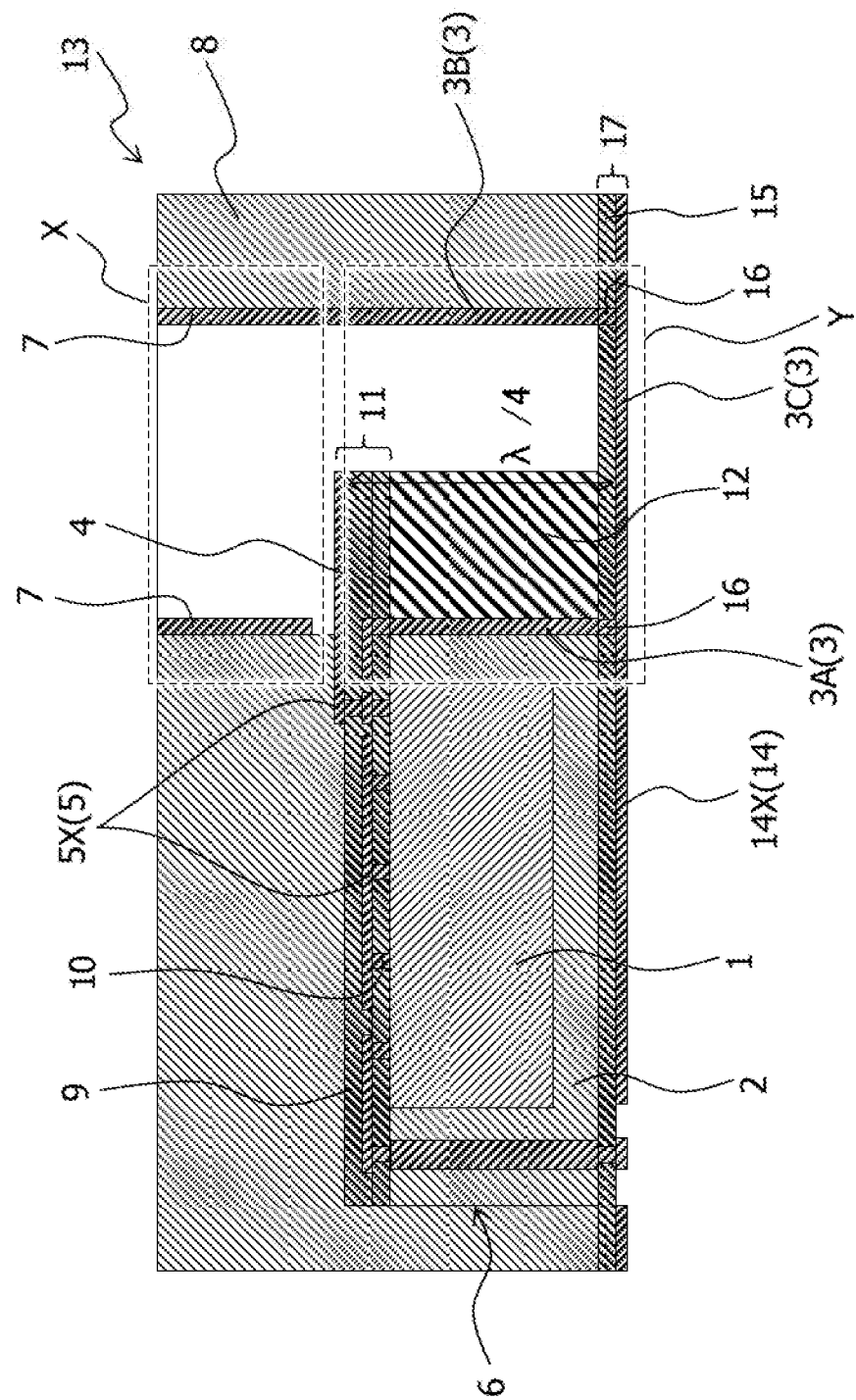
FIG. 1 is a schematic cross-sectional view illustrating the structure of a high frequency module according to an embodiment.

As illustrated in FIG. 1, the high frequency module according to the present embodiment includes: a package section 6 including a semiconductor chip 1, a first portion 3A (in this example, part of the side portion) of a backshort 3 integrated with the semiconductor chip 1 by a first resin 2, and a first rewiring line 5 electrically connected to the semiconductor chip 1 and including a portion to be an antenna coupler 4; and a waveguide 7 integrated with a second portion 3B of the backshort 3 (in this example, the remaining portion of the side portion of the backshort 3).

The first resin 2 is also referred to as a mold resin or a sealing resin. In FIG. 1, reference sign X indicates a region functioning as the waveguide 7, and reference sign Y indicates a region functioning as the backshort 3.

The package section 6 and the waveguide 7 integrated with the second portion 3B of the backshort 3 are integrated by a second resin 8, so that the portion to be the antenna coupler 4 is located between the waveguide 7 and the backshort 3.

In this example, the backshort 3 and the waveguide 7 are made of a metal (a conductor) such as Cu, for example.

The first rewiring line 5 is a wiring line (a transmission line; an MSL in this example) formed by a rewiring technique used for the pseudo SoC technique or the like, and includes the portion to be the antenna coupler 4.

In the present embodiment, the first rewiring line 5 is formed with a first line conductor 5X electrically connected to the semiconductor chip 1 via first vias 10 formed in a first resin layer (or a first dielectric film) 9 formed on the first resin 2. In this manner, a first rewiring layer 11 including the first rewiring line 5 (first line conductor 5X) electrically connected to the semiconductor chip 1 is formed on the first resin 2. The first rewiring line 5 extends to a portion between the waveguide 7 and the backshort 3, and this portion functions as the antenna coupler 4.

In this example, the first resin layer 9 is a photosensitive resin layer, for example. In a case where the first dielectric film is used, a film formed with a dielectric material having a low-dielectric constant (a low-dielectric constant material) or a low-loss dielectric material (a low-loss material) is used. For example, it is preferable to use a film formed with any one of materials selected from the group consisting of benzocyclobutene (BCB), liquid crystal polymer, cycloolefin polymer (COP), polyolefin, polyphenylene ether (PPE), polystyrene, and polytetrafluoroethylene. The first line conductor 5X is a metal wiring line made of a metal such as copper, for example.

As described above, in the present embodiment, with the use of an MSL-waveguide conversion structure using the FO-WLP technique, the semiconductor chip 1 and a portion (the first portion) 3A of the side portion of the backshort 3 are integrated by a resin (the first resin) 2, the antenna coupler 4 and the MSL 5 are formed by a rewiring technique, and the MSL 5 is electrically connected to the semiconductor chip 1. In this manner, the package section 6 is completed.

Thus, the MSL 5 can be connected to the semiconductor chip 1 without a solder or the like, and accordingly, it is possible to reduce characteristics degradation in the superhigh frequency region due to mounting. Furthermore, the length of the MSL 5 can be shortened, and thus, it is also possible to reduce influence on the characteristics.

In the present embodiment, the package section 6 includes a dielectric support 12 that supports the portion to be the antenna coupler 4. The dielectric support 12 is also referred to as an insulator support.

For example, the semiconductor chip 1, the portion (the first portion) 3A of the side portion of the backshort 3, and the dielectric support 12 are integrated by the resin (the first resin) 2, the antenna coupler 4 and the MSL 5 are formed by a rewiring technique so that the antenna coupler 4 is located on the dielectric support 12, and the MSL 5 is electrically connected to the semiconductor chip 1. In this manner, the package section 6 is completed.

For example, the conductor forming the portion 3A of the side portion of the backshort 3 is provided on a side portion of the dielectric support 12, and this conductor is disposed adjacent to the semiconductor chip 1 so that the conductor forming the portion 3A of the side portion of the backshort 3 is located on the side of the semiconductor chip 1. This conductor is then integrated with the semiconductor chip 1 by the resin (the first resin) 2 (see FIGS. 4A and 4B, for example).

As the dielectric support 12 is provided to support the antenna coupler 4 that is part of the first rewiring line 5 as described above, the position of the antenna coupler 4 can be maintained, and characteristics degradation can be reduced.

In this example, the dielectric support 12 is made of a dielectric material.

For example, it is preferable to use a dielectric material having a low-dielectric constant (a low-dielectric constant material) or a low-loss dielectric material (a low-loss material).

For example, it is preferable to use a film formed with any one of materials selected from the group consisting of benzocyclobutene (BCB), liquid crystal polymer (LCP), cycloolefin polymer (COP), polyolefin, polyphenylene ether (PPE), polystyrene, and polytetrafluoroethylene (PTFE; fluorine resin). With this, it is possible to reduce the decrease in high-frequency gain, and reduce the loss.

Further, in the present embodiment, the package section 6 including the portion (the first portion) 3A of the side portion of the backshort 3 and the waveguide 7 integrated with the remaining portion (the second portion) 3B of the side portion of the backshort 3 are integrated by the resin (the second resin) 8, so that the portion to be the antenna coupler 4 is located between the waveguide 7 and the backshort 3.

The second resin 8 may be the same resin as the first resin 2, or may be a different resin from the first resin 2. The second resin 8 is also referred to as a mold resin or a sealing resin.

In this case, in a high frequency module 13, the MSL 5 and the antenna coupler 4 formed as part of the MSL 5, and the waveguide 7 and the backshort 3 formed on both the upper and lower sides of the antenna coupler 4 are sealed inside the mold resin 8, so that the antenna coupler 4 is located at an opening of the boundary portion between the waveguide 7 and the backshort 3.

With this structure, as illustrated in FIGS. 15A and 15B, for example, surface mounting of a waveguide or a backshort is not necessarily performed. Furthermore, the backshort 3 is partially integrated with the waveguide 7. Accordingly, it is possible to reduce the occurrence of positional deviation between the waveguide 7 and the backshort 3, and reduce formation of a discontinuous structure. Thus, it is possible to reduce characteristics degradation (variation) due to positional deviation.

Referring now to FIGS. 2A through 2D, the influence of positional deviation between the waveguide 7 and the backshort 3 is described.

FIG. 2A illustrates an analysis model. As indicated by reference sign d in FIG. 2A, the waveguide was made to deviate in the wiring direction of the MSL, and the reflection characteristics and the pass characteristics were calculated by electromagnetic field analysis. The results of the calculation are as illustrated in FIGS. 2B and 2C.

FIG. 2B illustrates the results of calculation of the reflection characteristics (S11), and FIG. 2C illustrates the results of calculation of the pass characteristics (S21).

In this example, the examination was conducted at a frequency in the neighborhood of 1 THz, and the dimensions of the waveguide were 160 µm in width and 80 µm in height. Further, in FIGS. 2B and 2C, reference sign A represents a case where the deviation amount was −20 µm, reference sign B represents a case where the deviation amount was −10 µm, reference sign C represents a case where the deviation amount was 0 µm, reference sign D represents a case where the deviation amount was 10 µm, and reference sign E represents a case where the deviation amount was 20 µm.

As can be seen from FIGS. 2B and 2C, if the waveguide mounted on the upper surface deviates only about 10 µm in the axial direction of the MSL, the reflection characteristics and the pass characteristics will change greatly.

FIG. 2D illustrates changes in the reflection characteristics and the pass characteristics with respect to the positional deviation at 1 THz.

As can be seen from FIG. 2D, the characteristics are degraded as the deviation amount becomes larger, with the reference case being a case where the deviation amount d is 0 µm in the waveguide mounted on the upper surface.

Characteristics degradation due to such positional deviation occurs in a case where a MSL-waveguide conversion structure illustrated in FIG. 15A or 15B is used, for example, and surface mounting is performed by joining a waveguide or a backshort with a solder or a silver paste or the like, for example.

On the other hand, where the above described structure of the present embodiment (see FIG. 1) is adopted, it is possible to reduce characteristics degradation due to such positional deviation.

Further, in the present embodiment, the periphery of the waveguide 7 is covered with the mold resin 8. Accordingly, a sufficient strength can be secured, and there is no need to increase the thickness of the conductor forming the waveguide 7 to secure the strength of the waveguide 7. Thus, the thickness of the conductor forming the waveguide 7 can be reduced, the weight can be reduced, and further, the module 13 can be made smaller in size.

Meanwhile, the present embodiment further includes a second rewiring line 14 that is formed on the second resin 8, is connected to the side portions (the first portion 3A and the second portion 3B) of the backshort 3, and includes the portion to be the bottom portion (a third portion) 3C of the backshort 3.

In this example, the distance between the antenna coupler 4 and the bottom portion 3C of the backshort 3 is ¼ ($\lambda/4$) of the wavelength $\lambda$ of the high-frequency signal to be transmitted. In this example, the bottom portion 3C of the backshort 3 is a ground plane separated from the antenna coupler 4 by $\lambda/4$.

Here, the second rewiring line 14 is a wiring line formed by a rewiring technique, and includes the portion to be the bottom portion 3C of the backshort 3.

In the present embodiment, the second rewiring line 14 is formed with a second line conductor 14X connected to the first portion 3A and the second portion 3B of the backshort 3 via second vias 16 formed in a second resin layer 15 (or a second dielectric film) formed on the second resin 8.

In this manner, a second rewiring layer 17 including the second rewiring line 14 (second line conductor 14X) connected to the first portion 3A and the second portion 3B of the backshort 3 is formed on the second resin 8.

The second rewiring line 14 is made of the same material as the first rewiring line 5 described above.

Although the portion to be the bottom portion 3C of the backshort 3 is formed by a rewiring technique in the present embodiment, the present invention is not limited to this. For example, the portion to be the bottom portion (the third portion) 3C of the backshort 3 may be joined to the end portions of the side portions 3A and 3B of the backshort 3. Further, the portion to be the bottom portion 3C of the backshort 3 may also be integrated with the waveguide 7 together with the remaining portion 3B of the side portion of the backshort 3. For example, the waveguide 7 may be a waveguide integrated with the remaining portion 3B and the bottom portion 3C (the second portion) of the side portion of the backshort 3.

Figure 3:
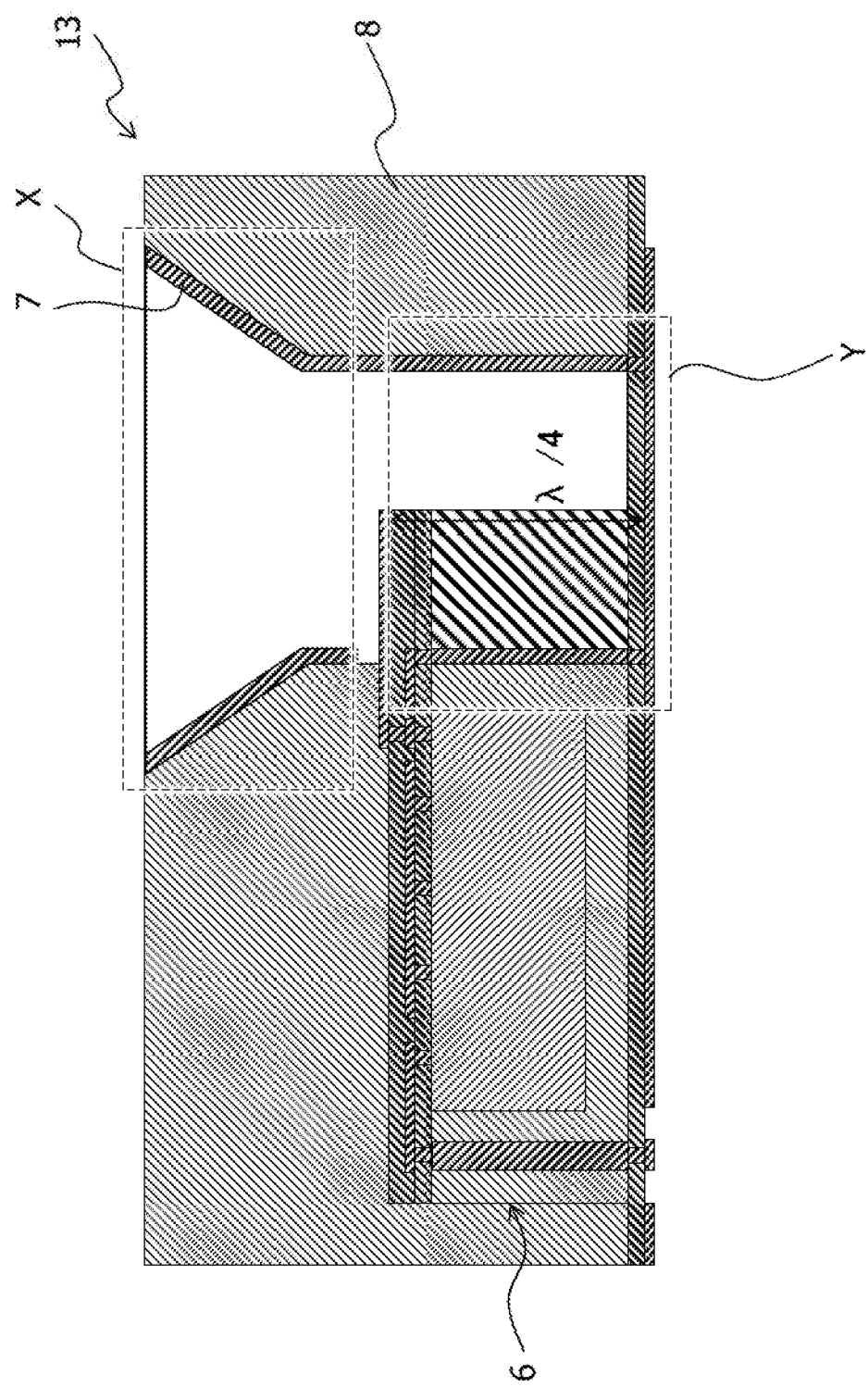
FIG. 3 is a schematic cross-sectional view illustrating the structure of a modification of a high frequency module according to the present embodiment.

Alternatively, the waveguide 7 may have a horn antenna shape, as illustrated in FIG. 3. For example, the top end of the waveguide 7 may have a horn antenna shape. In FIG. 3, reference sign X indicates a region functioning as the waveguide and a horn antenna, and reference sign Y indicates a region functioning as the backshort.

With this, it is possible to produce a high frequency module 13 in which the horn antenna is incorporated into and integrated with the mold resin 8. As a result, it is possible to produce a small-size communication device that enables signal generation to transmission and reception of radio waves with one chip.

Next, a method of manufacturing a high frequency module according to the present embodiment is described.

A method of manufacturing a high frequency module according to the present embodiment includes: a step of manufacturing the package section 6 including the semiconductor chip 1, the first portion 3A of the backshort 3 integrated with the semiconductor chip 1 by the first resin 2, and the first rewiring line 5 electrically connected to the semiconductor chip 1 and including the portion to be the antenna coupler 4 (see FIGS. 4A through 6B, for example); a step of manufacturing the waveguide 7 integrated with the second portion 3B of the backshort 3 (see FIGS. 7A through 7C, for example); and a step of integrating the package section 6 and the waveguide 7 with the second resin 8, to dispose the portion to be the antenna coupler 4 between the waveguide 7 and the backshort 3 (see FIGS. 8 through 13, for example).

In the present embodiment, the step of manufacturing the package section 6 includes: a step of integrating the semiconductor chip 1 and the first portion 3A of the backshort 3 with the first resin 2 (see FIGS. 4A through 5B, for example); and a step of forming the first rewiring line 5 to be electrically connected to the semiconductor chip 1 (see FIGS. 6A and 6B, for example). The step of manufacturing the package section 6 further includes a step of forming a dielectric support 12 that supports the portion to be the antenna coupler 4 (see FIGS. 4A and 4B, for example).

Further, in the present embodiment, the step of manufacturing the waveguide 7 includes a step of forming the conductor 24 to be the waveguide 7 on the wall surface of a sacrifice layer 23 (see FIGS. 7A through 7C, for example), and the method further includes a step of removing the sacrifice layer 23 (see FIG. 13, for example) after the step of integrating the package section 6 and the waveguide 7 with the second resin 8.

Further, in the present embodiment, the step of forming the first rewiring line 5 includes a step of forming the first line conductor 5X electrically connected to the semiconductor chip 1 via the first vias 10 formed in the first resin layer 9 or the first dielectric film formed on the first resin 2 (see FIGS. 6A and 6B, for example).

In the present embodiment, the method further includes a step of forming, on the second resin 8, the second rewiring line 14 that is connected to the first portion 3A and the second portion 3B of the backshort 3 and includes the portion to be the third portion 3C of the backshort 3 (see FIG. 12, for example), after the step of integrating the package section 6 and the waveguide 7 with the second resin 8.

Figure 12:
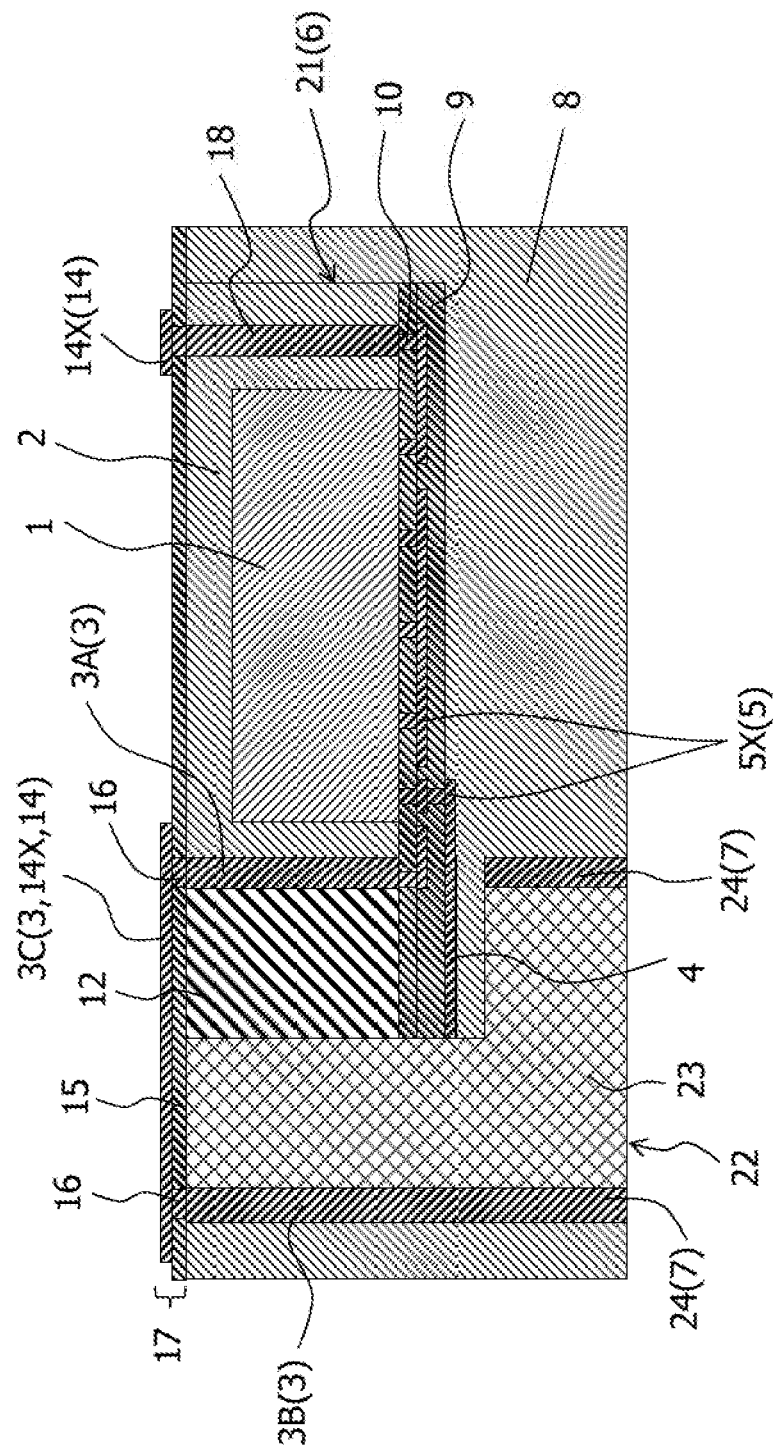
FIG. 12 is a schematic cross-sectional view for explaining the method of manufacturing a high frequency module according to the present embodiment.

Further, in the present embodiment, the step of forming the second rewiring line 14 includes a step of forming the second line conductor 14X connected to the first portion 3A and the second portion 3B of the backshort 3 via the second vias 16 formed in the second resin layer 15 or the second dielectric film formed on the second resin 8 (see FIG. 12, for example).

In the description below, the method is described in greater detail by way of a specific example, with reference to FIGS. 4A through 13.

First, as illustrated in FIG. 4A, semiconductor chips 1, dielectric supports 12 for supporting antenna couplers, pins 18 for bias and signal propagation, for example, and the like are disposed on a support substrate 19 made of a material such as stainless steel, for example.

In this example, the conductor forming the portion (the first portion) 3A of each side portion of the backshorts 3 is provided on a side surface of each corresponding dielectric support 12.

As illustrated in FIG. 4B, the respective components such as the semiconductor chips 1 mounted on the support substrate 19 are then sealed with the mold resin (first resin) 2, and are integrated to form a pseudo wafer 20.

As illustrated in FIG. 5A, the support substrate 19 is then removed. As illustrated in FIG. 5B, the mold resin 2 is ground and thinned by back grinding, for example, so that the terminals of the pins 18, ends of the portions 3A of the side surfaces of the backshorts 3, and the dielectric supports 12 are exposed.

As illustrated in FIG. 6A, the first rewiring layer 11 including the first rewiring line 5 is then formed on the terminal surface of the pseudo wafer 20 by a rewiring technique.

For example, the insulating layer (the first resin layer) 9 forming the first rewiring layer 11 is formed by using a photosensitive phenolic resin (about 10 μm in thickness) as a resin material, exposing the resin material to light, performing development with tetramethyl ammonium hydroxide (TMAH), for example, and curing (hardening) the resin material at about 200 to 250 degrees C. (about 200 degrees C., for example).

Meanwhile, the wiring layer (a wiring line, the first line conductor 5X, or the first rewiring line 5) forming the first rewiring layer 11 is formed by forming a seed layer including a Ti (titanium) layer (about 20 nm in thickness) and a Cu (copper) layer (about 100 nm in thickness) by sputtering, applying a resist of about 8 μm onto the seed layer, for example, performing exposure, performing development with TMAH to form a resist pattern, for example, depositing Cu on the resist pattern by electrolytic plating using the above seed layer as the feed layer, for example, and removing the resist.

Such a process is repeated to form a desired number of insulating layers 9 and wiring layers 5X (5) described above. The wiring layers 5X (5) and the semiconductor chips 1, and the upper and lower wiring layers 5X (5) are connected by vias (first vias) 10, so that the first rewiring layer 11 is formed. In this example, when the wiring layer 5X (5) on the outermost surface side of the first rewiring layer 11 is formed, the portions to be the antenna couplers 4 are formed.

As illustrated in FIG. 6B, the pseudo wafer 20 thus obtained is singulated by dicing with a conventional diamond blade, for example, so that first blocks 21 are obtained.

In this manner, the first blocks 21 to be the package sections 6 each including the semiconductor chip 1, the first rewiring line 5 including the portion to be the antenna coupler 4, the portion (the first portion) 3A of the side portion of the backshort 3, the dielectric support 12 are manufactured.

Figure 7A:
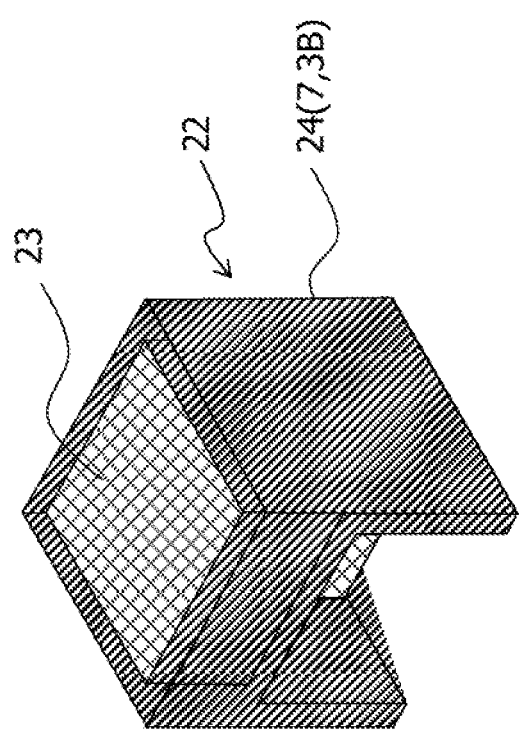
FIGS. 7A through 7C are schematic views for explaining the method of manufacturing a high frequency module according to the present embodiment.
Figures 7B, 7C:
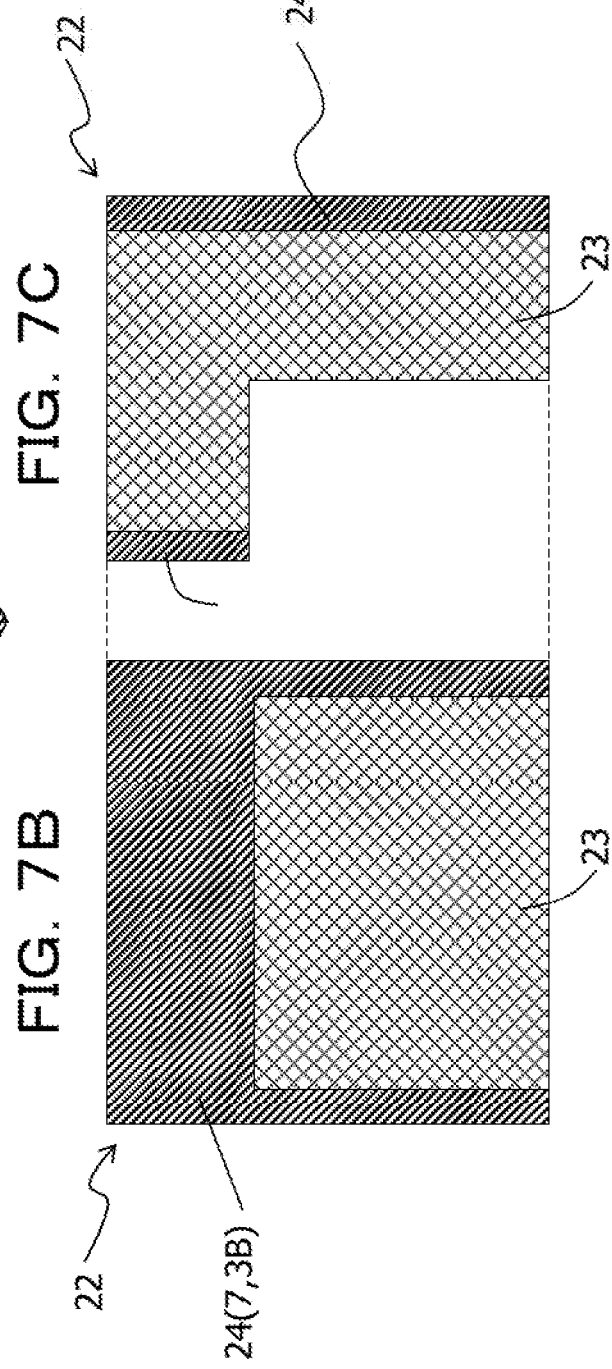

Meanwhile, as illustrated in FIGS. 7A through 7C, second blocks 22 that are to be the waveguides 7 integrated with the remaining portions (the second portions) 3B of the side portions of the backshorts 3 are manufactured.

In this example, each second block 22 is formed with the sacrifice layer 23 made of a phenolic resist material, for example, and the conductor (a conductive film or a metal film) 24 that is formed by electroless plating on side surfaces (four side surfaces in this example) of the sacrifice layer 23 and is made of Cu, for example.

The conductor 24 having the four wall surfaces becomes the waveguide 7 integrated with the remaining portion (the second portion) 3B of the side portion of the backshort 3. In this case, the waveguide 7 can be formed by a conductor 24 having a small thickness. This is because sealing is to be performed with the mold resin (the second resin) 8, and therefore, it is not necessary to secure the strength with the waveguide, as will be described later. Accordingly, the size and the weight can be made smaller than in a case where a waveguide formed with a metal piece is used as illustrated in FIG. 14, for example.

The sacrifice layer 23 is adopted, so that the first blocks 21 and the second blocks 22 can be accurately positioned, and the mold resin 8 is kept from filling the inside of each waveguide 7 (including the remaining portion 3B of the side portion of each backshort 3), as will be described later.

In this example, part of each second block 22 is ground by a grinder, for example, so that the portions to be the antenna couplers 4 enter the inside of the second blocks 22 when the second blocks 22 are integrated with the first blocks 21 by the resin (the second resin) 8 in the manner described later.

Figure 8:
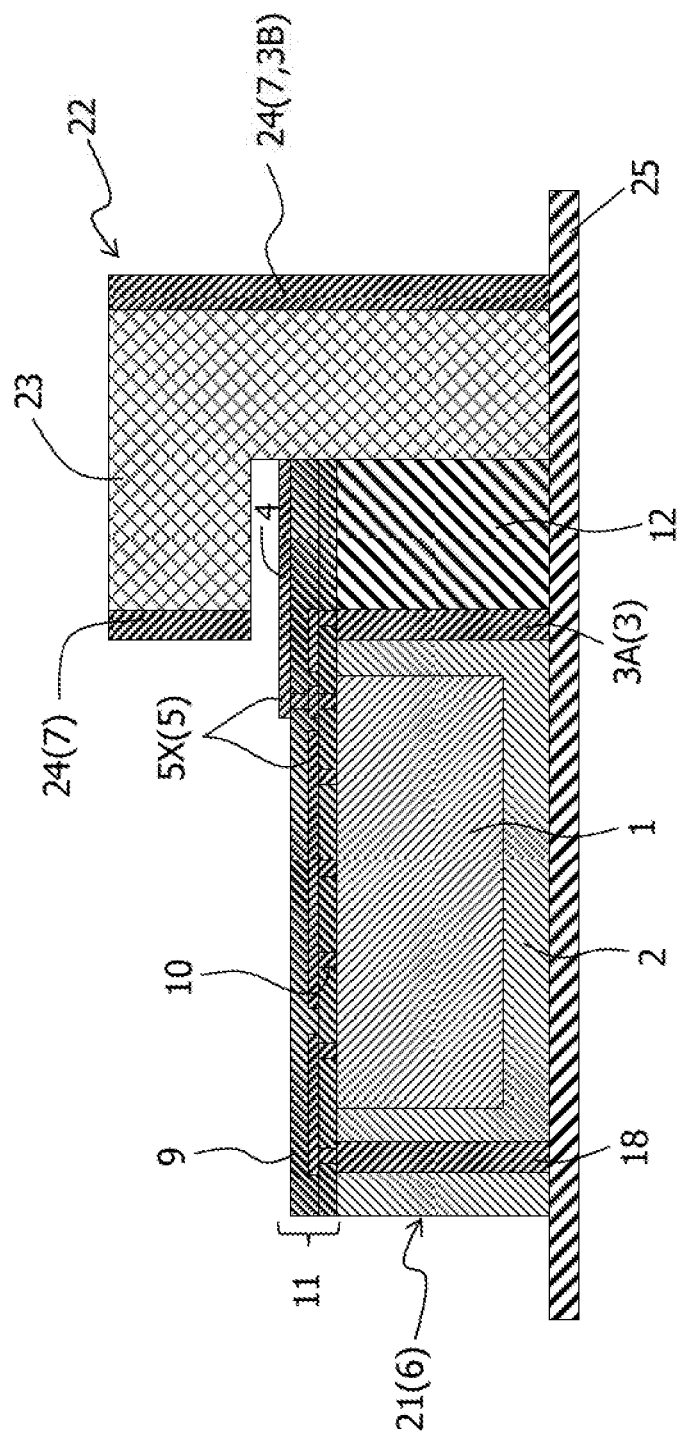
FIG. 8 is a schematic cross-sectional view for explaining the method of manufacturing a high frequency module according to the present embodiment.

As illustrated in FIG. 8, each first block 21 and each second block 22 are then disposed on a support substrate 25 made of stainless steel, for example. In this step, the second block 22 is disposed so as to cover the antenna coupler 4 in the first block 21 from above.

In this example, the inside of the conductor 24 to be the waveguide 7 (including the remaining portion 3B of the side portion of the backshort 3) of the second block 22 is filled with the sacrifice layer 23, and thus, positioning of the first block 21 and the second block 22 can be performed with high accuracy. For example, the position of the portion 3A of the side portion of the backshort 3 in the first block 21 can be accurately adjusted to the position of part of the waveguide 7 (24) that is in the second block 22 and is located on the opposite side of the antenna coupler 4 in the first block 21.

Figure 9:
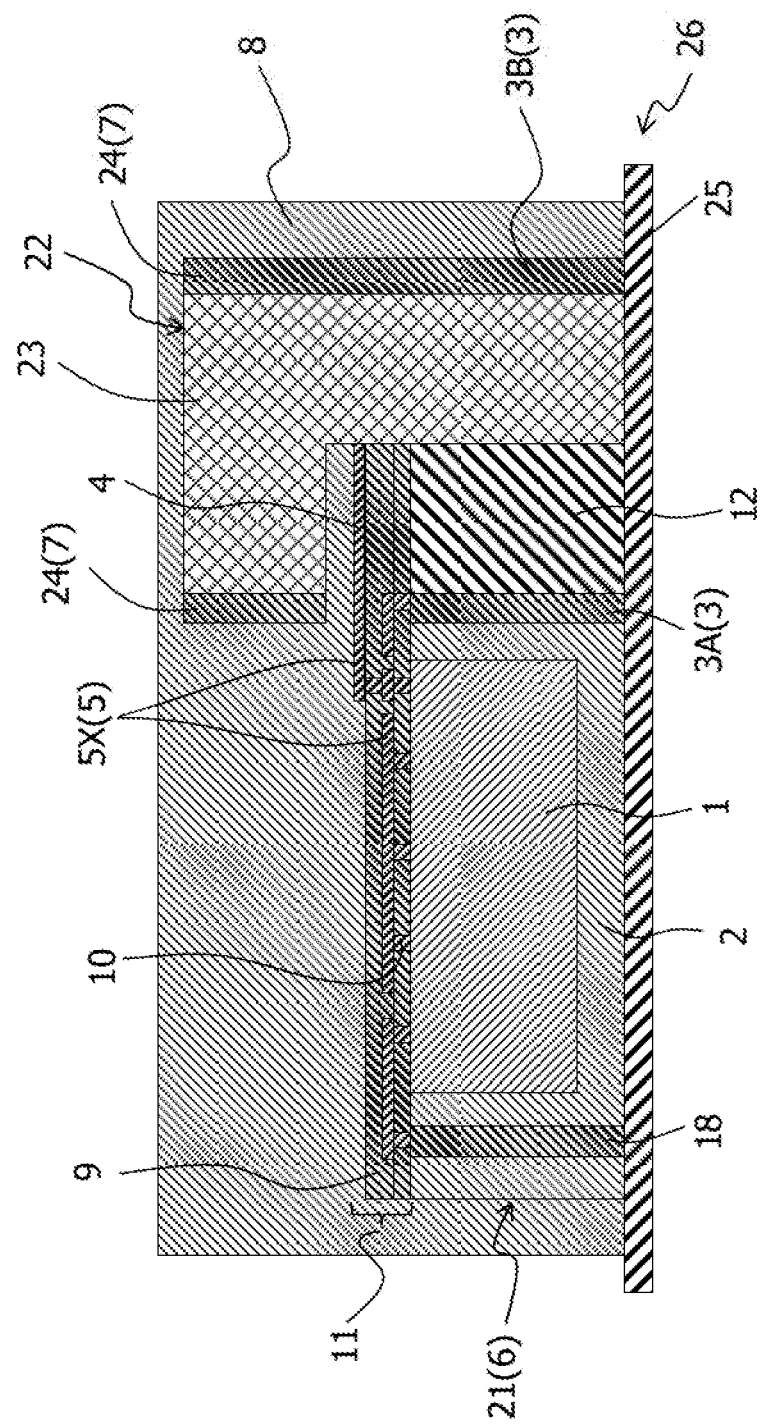
FIG. 9 is a schematic cross-sectional view for explaining the method of manufacturing a high frequency module according to the present embodiment.

As illustrated in FIG. 9, the first block 21 and the second block 22 are then sealed and integrated by the mold resin (the second resin) 8, to form a pseudo wafer 26.

Since the inside of the conductor 24 to be the waveguide 7 (including the remaining portion 3B of the side portion of the backshort 3) of the second block 22 is filled with the sacrifice layer 23, the inside of the conductor 24 to be the waveguide 7 (including the remaining portion 3B of the side portion of the backshort 3) is not filled with the mold resin 8.

Figure 10:
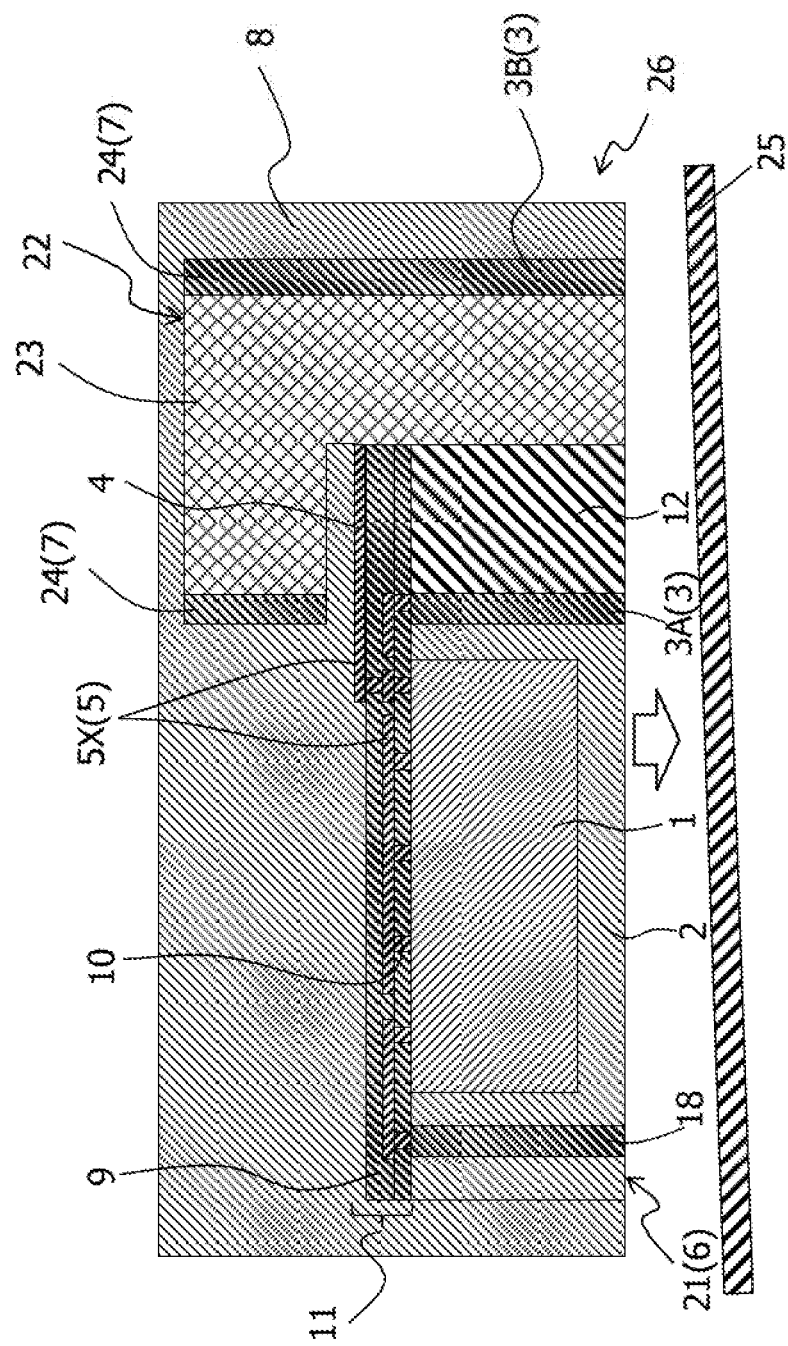
FIG. 10 is a schematic cross-sectional view for explaining the method of manufacturing a high frequency module according to the present embodiment.
Figure 11:
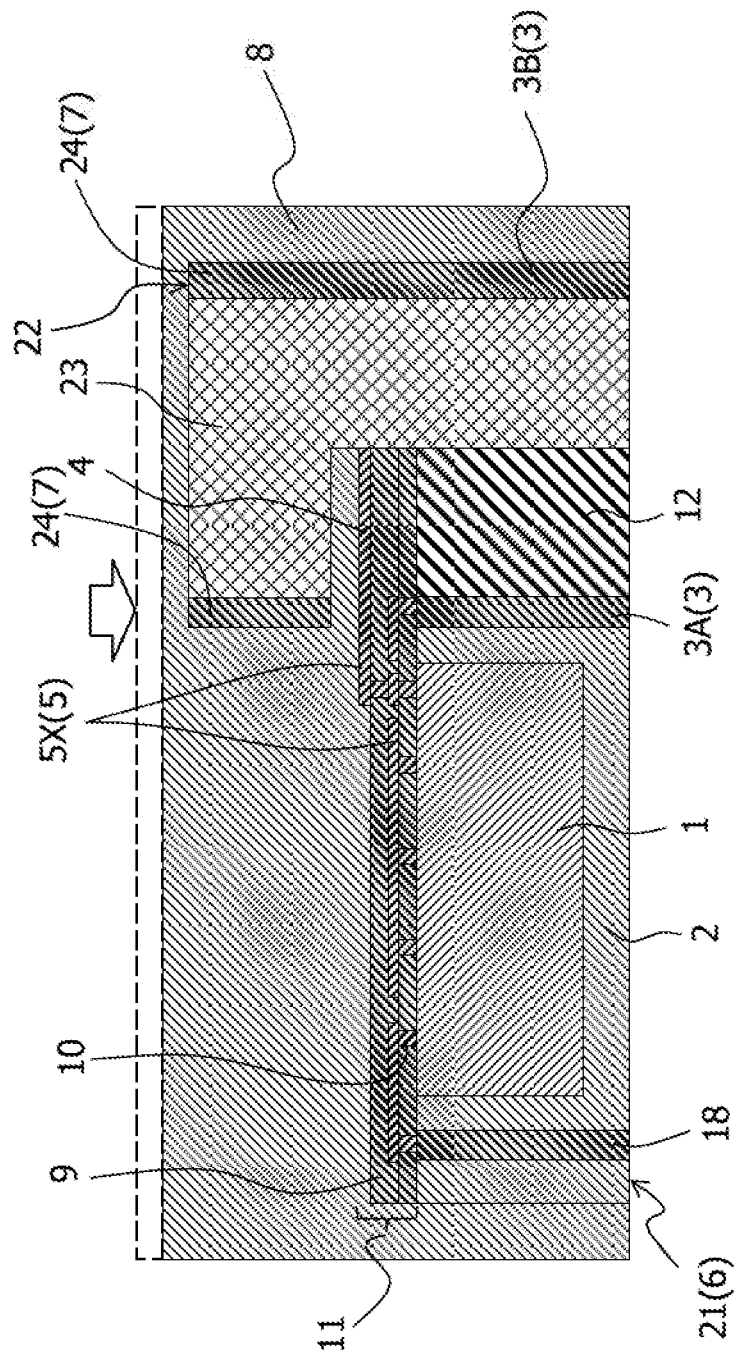
FIG. 11 is a schematic cross-sectional view for explaining the method of manufacturing a high frequency module according to the present embodiment.

As illustrated in FIG. 10, the support substrate 25 is then removed. As illustrated in FIG. 11, the mold resin 8 is ground and thinned by back grinding, for example, and an end of the second block 22, or an end of the waveguide 7 (24) and an end of the sacrifice layer 23, is exposed.

In this manner, the package section 6 and the waveguide 7 integrated with the remaining portion (the second portion) 3B of the side portion of the backshort 3 are integrated by the resin (the second resin) 8, so that that the portion to be the antenna coupler 4 is located between the waveguide 7 and the backshort 3.

As illustrated in FIG. 12, the second rewiring layer 17 including the second rewiring line 14 is then formed by a rewiring technique on the side on which the side portion (the first portion 3A and the second portion 3B) of the backshort 3 is provided.

For example, the insulating layer (the second resin layer) 15 forming the second rewiring layer 17 is formed by using a photosensitive phenolic resin (about 10 μm in thickness) as a resin material, exposing the resin material to light, performing development with TMAH, for example, and curing (hardening) the resin material at about 200 to 250 degrees C. (about 200 degrees C., for example).

Meanwhile, the wiring layer (a wiring line, the second line conductor 14X, or the second rewiring line 14) forming the second rewiring layer 17 is formed by forming a seed layer including a Ti (titanium) layer (about 20 nm in thickness) and a Cu (copper) layer (about 100 nm in thickness) by sputtering, applying a resist of about 8 μm onto the seed layer, for example, performing exposure, performing development with TMAH to form a resist pattern, for example, depositing Cu on the resist pattern by electrolytic plating using the above seed layer as the feed layer, for example, and removing the resist.

Such a process is repeated to form a desired number of insulating layers 15 and wiring layers 14X (14) described above. The wiring layers 14X (14) are connected by vias (second vias) 16, so that the second rewiring layer 17 is formed.

In this example, when the first wiring layer 14X (14) of the second rewiring layer 17 is formed, the shorting face (the bottom portion of the backshort, or the third portion) 3C of the backshort 3 is formed as the wiring layer (a wiring line, the second line conductor 14X, or the second rewiring line 14) at the position corresponding to the side portion (the first portion 3A and the second portion 3B) of the backshort 3 integrated with the waveguide 7, and is connected to the side portions 3A and 3B of the backshort 3 via the vias (the second vias) 16.

Figure 13:
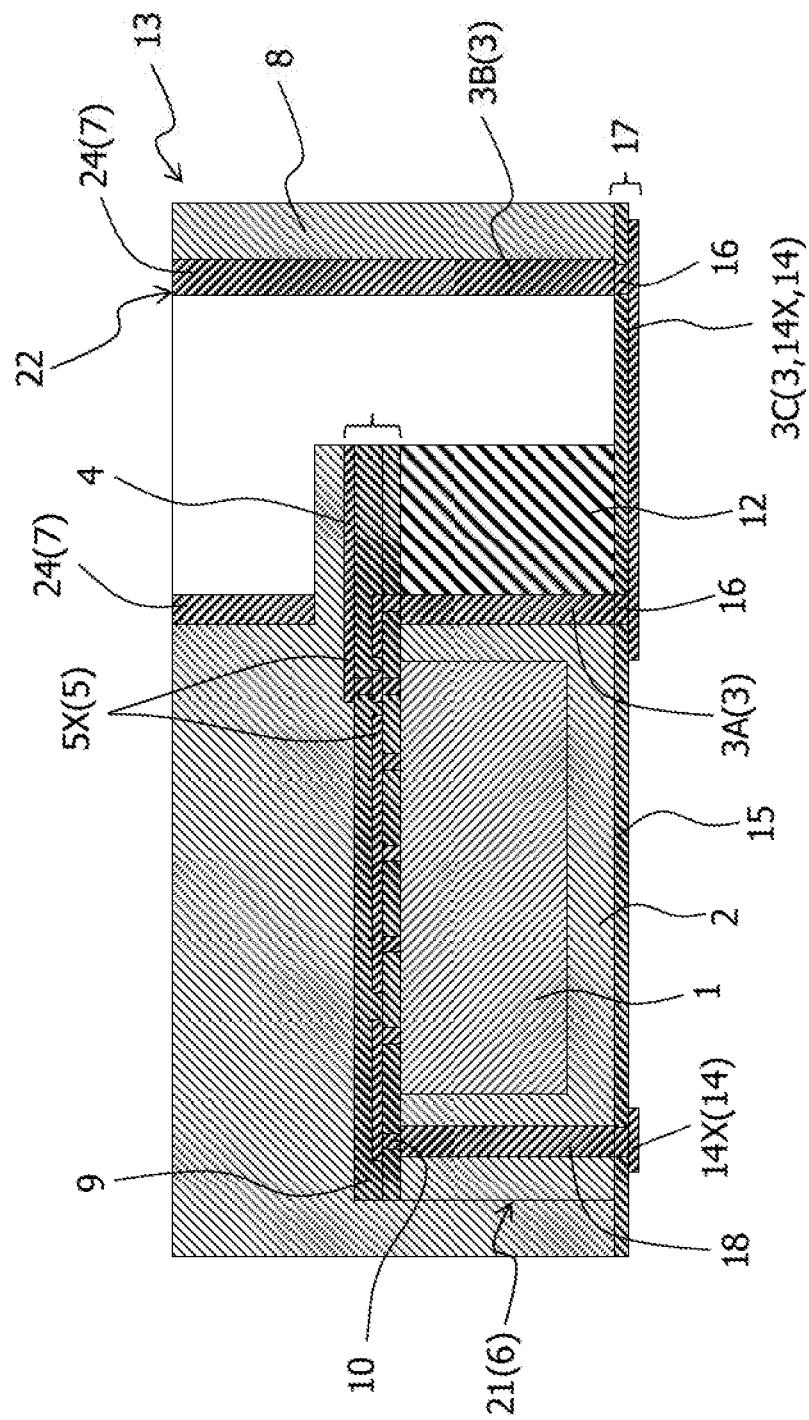
FIG. 13 is a schematic cross-sectional view for explaining the method of manufacturing a high frequency module according to the present embodiment.

As illustrated in FIG. 13, the sacrifice layer 23 in the second block 22 is then removed with TMAH, for example, so that a hollow waveguide structure is formed.

Singulation is then performed with a conventional dicing blade, for example. Thus, desired high frequency modules 13 can be obtained.

Accordingly, a high frequency module and the method of manufacturing the high frequency module according to the present embodiment have an effect to reduce characteristics degradation due to positional deviation between the waveguide 7 and the backshort 3.

Note that the present invention is not limited to the structure described in the embodiment described above, and various modifications may be made to it without departing from the scope of the invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A high frequency module comprising:
    a package section including a semiconductor chip, a first portion of a backshort being integrated with the semiconductor chip by a first resin, and a first rewiring line electrically coupled to the semiconductor chip and including a portion to be an antenna coupler;
    a waveguide with which a second portion of the backshort is integrated, wherein the package section and the waveguide are integrated by a second resin, to position the portion to be the antenna coupler between the waveguide and the backshort; and
    a second rewiring line that is formed over the second resin, is coupled to the first portion and the second portion of the backshort, and includes a portion to be a third portion of the backshort,
    wherein the second rewiring line is formed with a second line conductor coupled to the first portion and the second portion of the backshort via a second via formed over a second resin layer or a second dielectric film formed over the second resin.

2. The high frequency module according to claim 1, wherein the package section includes a dielectric support that supports the portion to be the antenna coupler.

3. The high frequency module according to claim 1, wherein the waveguide has a horn antenna shape.

4. The high frequency module according to claim 1, wherein the first rewiring line is formed with a first line conductor electrically coupled to the semiconductor chip via a first via formed in a first resin layer or a first dielectric film formed over the first resin.

* * * * *